United States Patent
Hsu

(10) Patent No.: US 11,003,237 B2
(45) Date of Patent: May 11, 2021

(54) METHOD FOR PERFORMING POWER MANAGEMENT IN A MEMORY DEVICE, ASSOCIATED MEMORY DEVICE AND CONTROLLER THEREOF, AND ASSOCIATED ELECTRONIC DEVICE

(71) Applicant: Silicon Motion Inc., Hsinchu County (TW)

(72) Inventor: Tzu-Wei Hsu, New Taipei (TW)

(73) Assignee: Silicon Motion, Inc., Hsinchu County (TW)

( * ) Notice: Subject to any disclaimer, the term of this patent is extended or adjusted under 35 U.S.C. 154(b) by 414 days.

(21) Appl. No.: 16/039,302

(22) Filed: Jul. 18, 2018

(65) Prior Publication Data

US 2019/0317587 A1 Oct. 17, 2019

Related U.S. Application Data

(60) Provisional application No. 62/656,364, filed on Apr. 12, 2018.

(51) Int. Cl.
| | |
|---|---|
| *G06F 1/32* | (2019.01) |
| *G06F 1/3234* | (2019.01) |
| *G06F 1/3225* | (2019.01) |
| *G11C 5/14* | (2006.01) |
| *G06F 12/02* | (2006.01) |

(52) U.S. Cl.
CPC .............. *G06F 1/3268* (2013.01); *G06F 1/32* (2013.01); *G06F 1/3225* (2013.01); *G06F 1/3275* (2013.01); *G06F 1/3234* (2013.01); *G06F 12/0246* (2013.01); *G06F 2212/1004* (2013.01); *G06F 2212/1028* (2013.01); *G06F 2212/7206* (2013.01); *G11C 5/14* (2013.01); *G11C 5/143* (2013.01); *G11C 5/147* (2013.01); *Y02D 10/00* (2018.01); *Y02D 30/50* (2020.08)

(58) Field of Classification Search
None
See application file for complete search history.

(56) References Cited

U.S. PATENT DOCUMENTS

| | | | | |
|---|---|---|---|---|
| 7,606,947 B2* | 10/2009 | Lin | .................... | G06K 19/0719 710/11 |
| 9,379,497 B2* | 6/2016 | Liu | ....................... | H01R 13/665 |
| 10,466,756 B2* | 11/2019 | Fujimoto | .............. | G06F 3/0659 |
| 2005/0182881 A1 | 8/2005 | Chou | | |
| 2008/0162755 A1* | 7/2008 | Minami | ................ | G06F 13/385 710/74 |

(Continued)

*Primary Examiner* — Tanh Q Nguyen
(74) *Attorney, Agent, or Firm* — Winston Hsu

(57) ABSTRACT

A method for performing power management in a memory device, the associated memory device and the controller thereof, and the associated electronic device are provided. The memory device includes a non-volatile (NV) memory including at least one NV memory element. The method may include: during an initialization phase of the memory device, detecting whether a host device supports communications corresponding to a first communications protocol; and before detecting that the host device supports communications corresponding to the first communications protocol, controlling a physical layer (PHY) circuit within the memory device to keep staying at a power off state to save power, wherein the PHY circuit supports communications corresponding to the first communications protocol.

16 Claims, 9 Drawing Sheets

(56) References Cited

U.S. PATENT DOCUMENTS

| | | | |
|---|---|---|---|
| 2009/0070515 A1* | 3/2009 | So | G06F 13/4027 |
| | | | 710/311 |
| 2011/0022789 A1* | 1/2011 | Fujimoto | G06K 19/07 |
| | | | 711/103 |
| 2012/0191998 A1* | 7/2012 | Tazebay | H04L 12/12 |
| | | | 713/323 |
| 2015/0370315 A1 | 12/2015 | Unnikrishnan | |
| 2017/0192475 A1* | 7/2017 | Fujimoto | G06F 3/061 |
| 2019/0317587 A1* | 10/2019 | Hsu | G06F 1/3225 |

* cited by examiner

METHOD FOR PERFORMING POWER MANAGEMENT IN A MEMORY DEVICE, ASSOCIATED MEMORY DEVICE AND CONTROLLER THEREOF, AND ASSOCIATED ELECTRONIC DEVICE

CROSS REFERENCE TO RELATED APPLICATIONS

This application claims the benefit of U.S. provisional application No. 62/656,364, which was filed on Apr. 12, 2018, and is included herein by reference.

BACKGROUND OF THE INVENTION

1. Field of the Invention

The present invention is related to memory control, and more particularly, to a method for performing power management in a memory device, the associated memory device and the controller thereof, and the associated electronic device.

2. Description of the Prior Art

Developments in memory technology have led to the wide application of portable or non-portable memory devices, such as memory cards which conform to the SD/MMC, CF, MS and XD specifications, respectively, or embedded memory devices which conform to the UFS and eMMC specifications, respectively. Improving access control of memories in these memory devices remains an issue to be solved in the art.

NAND flash memories may comprise single level cell (SLC) and multiple level cell (MLC) flash memories. In an SLC flash memory, each transistor used as a memory cell may have any of two electrical charge values, respectively representing the logic values 0 and 1. The storage ability of each transistor used as a memory cell in an MLC flash memory may be fully utilized, where the transistor may be driven by a voltage higher than that in the SLC flash memory, and different voltage levels can be utilized to record information of at least two bits (e.g. 00, 01, 11, or 10). In theory, the recording density of the MLC flash memory may reach at least twice the recording density of the SLC flash memory, and is therefore preferred by manufacturers of NAND flash memories.

Compared with the SLC flash memory, the lower cost and larger capacity of the MLC flash memory means it is more likely to be applied in memory devices. The MLC flash memory does have instability issues, however. To ensure that access control of the flash memory in the memory device meets related specifications, a controller of the flash memory is usually configured to have management mechanisms to properly manage the access of data.

Related art memory devices with the above management mechanisms still have some disadvantages. For example, a memory device such as a memory card conforming to Secure Digital (SD) specification may be referred to as a SD memory card. Based on the architecture equipped with a 6-bit SD interface, the maximum of the data transmission rate of the SD memory card may reach 104 MB/sec. As the storage capacity becomes greater and greater due to the progress of the development, the data transmission rate seems to be insufficient. The related art tries to correct the problem, for example, by implementing the memory card with a different interface, but further problems are introduced. Thus, a novel method and associated architecture are needed for solving the problems without introducing any side effect or in a way that is less likely to introduce a side effect.

SUMMARY OF THE INVENTION

It is an objective of the present invention to provide a method and apparatus for performing power management in a memory device (e.g. SD Express memory card, etc.), for example, with aid of associated detection during an initialization phase, in order to solve the above-mentioned problems.

At least one embodiment of the present invention provides a method for performing power management in a memory device. The memory device may comprise a non-volatile (NV) memory, and the NV memory may comprise at least one NV memory element (e.g. one or more NV memory elements). The method may comprise: during an initialization phase of the memory device, detecting whether a host device supports communications corresponding to a first communications protocol; and before detecting that the host device supports communications corresponding to the first communications protocol, controlling a physical layer (PHY) circuit within the memory device to keep staying at a power off state to save power, wherein the PHY circuit supports communications corresponding to the first communications protocol.

In addition to the above method, the present invention also provides a memory device, and the memory device comprises a NV memory and a controller. The NV memory is arranged to store information, wherein the NV memory may comprise at least one NV memory element (e.g. one or more NV memory elements). The controller is coupled to the NV memory, and the controller is arranged to control operations of the memory device. In addition, the controller comprises a processing circuit that is arranged to control the controller according to a plurality of host commands from a host device to allow the host device to access the NV memory through the controller, and comprises a transmission interface circuit that is coupled to the processing circuit and arranged to perform communications with the host device for the memory device. For example, during an initialization phase of the memory device, the controller detects whether the host device supports communications corresponding to a first communications protocol. Before detecting that the host device supports communications corresponding to the first communications protocol, the controller controls a PHY circuit within the transmission interface circuit to keep staying at a power off state to save power, wherein the PHY circuit supports communications corresponding to the first communications protocol.

According to some embodiments, an associated electronic device is also provided. The electronic device may comprise the above memory device, and may further comprise: the host device, coupled to the memory device. The host device may comprise: at least one processor, arranged for controlling operations of the host device; and a power supply circuit, coupled to the at least one processor, arranged for providing power to the at least one processor and the memory device. In addition, the memory device may provide the host device with storage space.

In addition to the above method, the present invention also provides a controller of a memory device, where the memory device comprises the controller and a NV memory. The NV memory may comprise at least one NV memory element (e.g. one or more NV memory elements). In addition, the controller comprises a processing circuit that is arranged to control the controller according to a plurality of host commands from a host device, to allow the host device to access the NV memory through the controller, and comprises a transmission interface circuit that is coupled to the processing circuit and arranged to perform communications with the host device for the memory device. For example, during an initialization phase of the memory device, the controller detects whether the host device supports communications corresponding to a first communications protocol. Before detecting that the host device supports communications corresponding to the first communications protocol, the controller controls a PHY circuit within the transmission interface circuit to keep staying at a power off state to save power, wherein the PHY circuit supports communications corresponding to the first communications protocol.

The present invention method and associated apparatus can guarantee that the memory device can operate properly in various situations. For example, the method provides multiple control schemes for power management. In addition, with aid of associated detection during an initialization phase, the controller (e.g. power on control circuit therein) may selectively turn on or turn off one or more corresponding power switches within the controller, and the electronic device and the memory device will not suffer from unnecessary power consumption.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
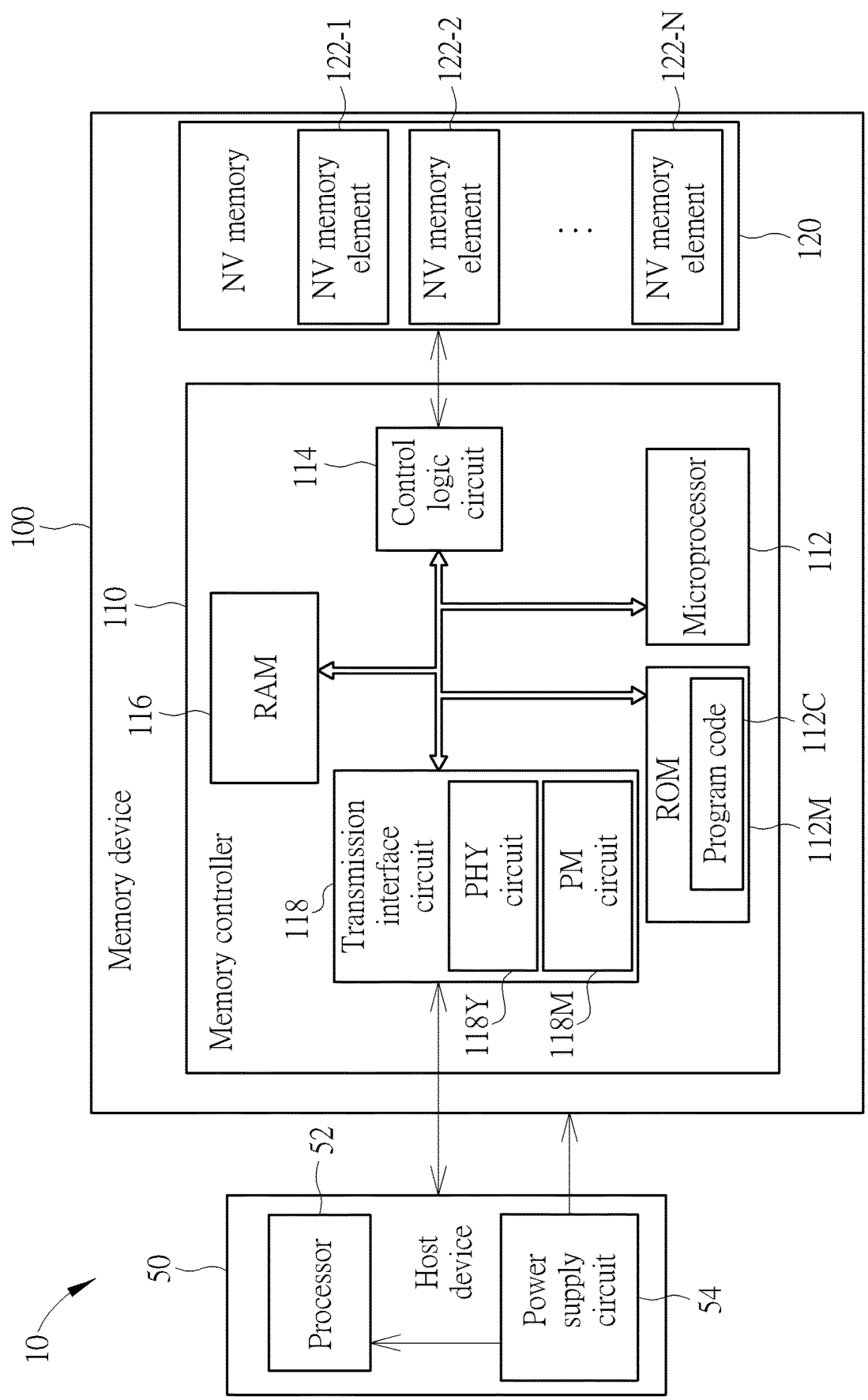
FIG. 1 is a diagram of a memory device and a host device according to an embodiment of the present invention.

FIG. 1 is a diagram of an electronic device 10 according to an embodiment of the present invention, where the electronic device 10 may comprise a host device 50 and a memory device 100. The host device 50 may comprise at least one processor (e.g. one or more processors) which may be collectively referred to as the processor 52, and may further comprise a power supply circuit 54 that is coupled to the processor 52. The processor 52 is arranged for controlling operations of the host device 50, and the power supply circuit 54 is arranged for providing power to the processor 52 and the memory device 100, and outputting one or more driving voltages to the memory device 100. The memory device 100 may be arranged for providing the host device 50 with storage space, and obtaining the one or more driving voltages from the host device 50 as power source of the memory device 100. Examples of the host device 50 may include, but are not limited to: a multifunctional mobile phone, a wearable device, a tablet computer, and a personal computer such as a desktop computer and a laptop computer. Examples of the memory device 100 may include, but are not limited to: a portable memory device (e.g. a memory card conforming to the SD/MMC, CF, MS or XD specification), a solid state drive (SSD), and various types of embedded memory devices conforming to the UFS and eMMC specifications, respectively. According to this embodiment, the memory device 100 may comprise a controller such as a memory controller 110, and may further comprise a non-volatile (NV) memory 120, where the controller is arranged to control operations of the memory device 100 and access the NV memory 120, and the NV memory 120 is arranged to store information. The NV memory 120 may comprise at least one NV memory element (e.g. one or more NV memory elements), such as a plurality of NV memory elements 122-1, 122-2, ..., and 122-N, where "N" may represent a positive integer that is greater than one. For example, the NV memory 120 may be a flash memory, and the plurality of NV memory elements 122-1, 122-2, ..., and 122-N may be a plurality of flash memory chips or a plurality of flash memory dies, but the present invention is not limited thereto.

As shown in FIG. 1, the memory controller 110 may comprise a processing circuit such as a microprocessor 112, a storage unit such as a read-only memory (ROM) 112M, a control logic circuit 114, a random access memory (RAM) 116, and a transmission interface circuit 118, where the above components may be coupled to one another via a bus. The RAM 116 is implemented by a Static RAM (SRAM), but the present invention is not limited thereto. The RAM 116 may be arranged to provide the memory controller 110 with internal storage space. For example, the RAM 116 may be utilized as a buffer memory for buffering data. In addition, the read-only memory 112M of this embodiment is arranged to store a program code 112C, and the microprocessor 112 is arranged to execute the program code 112C to control the access of the flash memory 120. Note that, in some examples, the program code 112C may be stored in the RAM 116 or any type of memory. Further, a data protection circuit (not shown) in the control logic circuit 114 may protect data and/or perform error correction, and the transmission interface circuit 118 may conform to a specific communications specification (e.g. the Serial Advanced Technology Attachment (SATA) specification, Universal Serial Bus (USB) specification, Peripheral Component Interconnect Express (PCIe) specification, embedded Multi Media Card (eMMC) specification, or Universal Flash Storage (UFS) specification), and may perform communications according to the specific communications specification, for example, perform communications with the host device 50 for the memory device 100.

More particularly, the transmission interface circuit 118 may conform to a newer communications specification (e.g. Secure Digital (SD) 7.0 specification, etc.), which may focus on communications of a higher speed and may be compatible to multiple communications specifications (e.g. PCIe specification, SD 6.0 specification, etc.), where the transmission interface circuit 118 may be compatible to the communications specifications. The transmission interface circuit 118 may comprise a physical layer (PHY) circuit 118Y (e.g. a PCIe PHY circuit) that supports communications corresponding to a first communications protocol (e.g. the PCIe protocol), and may further comprise a power management (PM) circuit 118M for performing power management to control power of the PHY circuit 118Y. For example, the host device 50 may support communications corresponding to the first communications protocol, and the transmission interface circuit 118 may perform communications with the host device 50 through the PHY circuit 118Y. For another example, the host device 50 may support communications corresponding to a second communications protocol, rather than the first communications protocol, and the transmission interface circuit 118 may perform communications with the host device 50 without using the PHY circuit 118Y. In addition, the power management circuit 118M may perform power management, more particularly, perform voltage detection on at least one driving voltage of the memory device 100 at the corresponding driving voltage input terminal during an initialization phase of the memory device 100, in order to selectively turn on or turn off one or more power switches within the memory controller 110. For example, the memory controller may turn on or turn off power of the PHY circuit 118Y through the one or more power switches in different situations, respectively. As a result, unnecessary power consumption can be prevented.

In this embodiment, the host device 50 may transmit host commands and corresponding logical addresses to the memory controller 110 to access the memory device 100. The memory controller 110 receives the host commands and the logical addresses, and translates the host commands into memory operating commands (which may be simply referred to as operating commands), and further controls the NV memory 120 with the operating commands to perform reading, writing/programing, etc. on memory units (e.g. data pages) having physical addresses within the flash memory 120, where the physical addresses correspond to the logical addresses. When the memory controller 110 perform an erase operation on any NV memory element 122-$n$ of the plurality of NV memory elements 122-1, 122-2, . . . , and 122-N (in which "n" may represent any integer in the interval [1, N]), at least one block of multiple blocks of the NV memory element 122-$n$ may be erased, where each block of the blocks may comprise multiple pages (e.g. data pages), and an access operation (e.g. reading or writing) may be performed on one or more pages.

Figure 2:
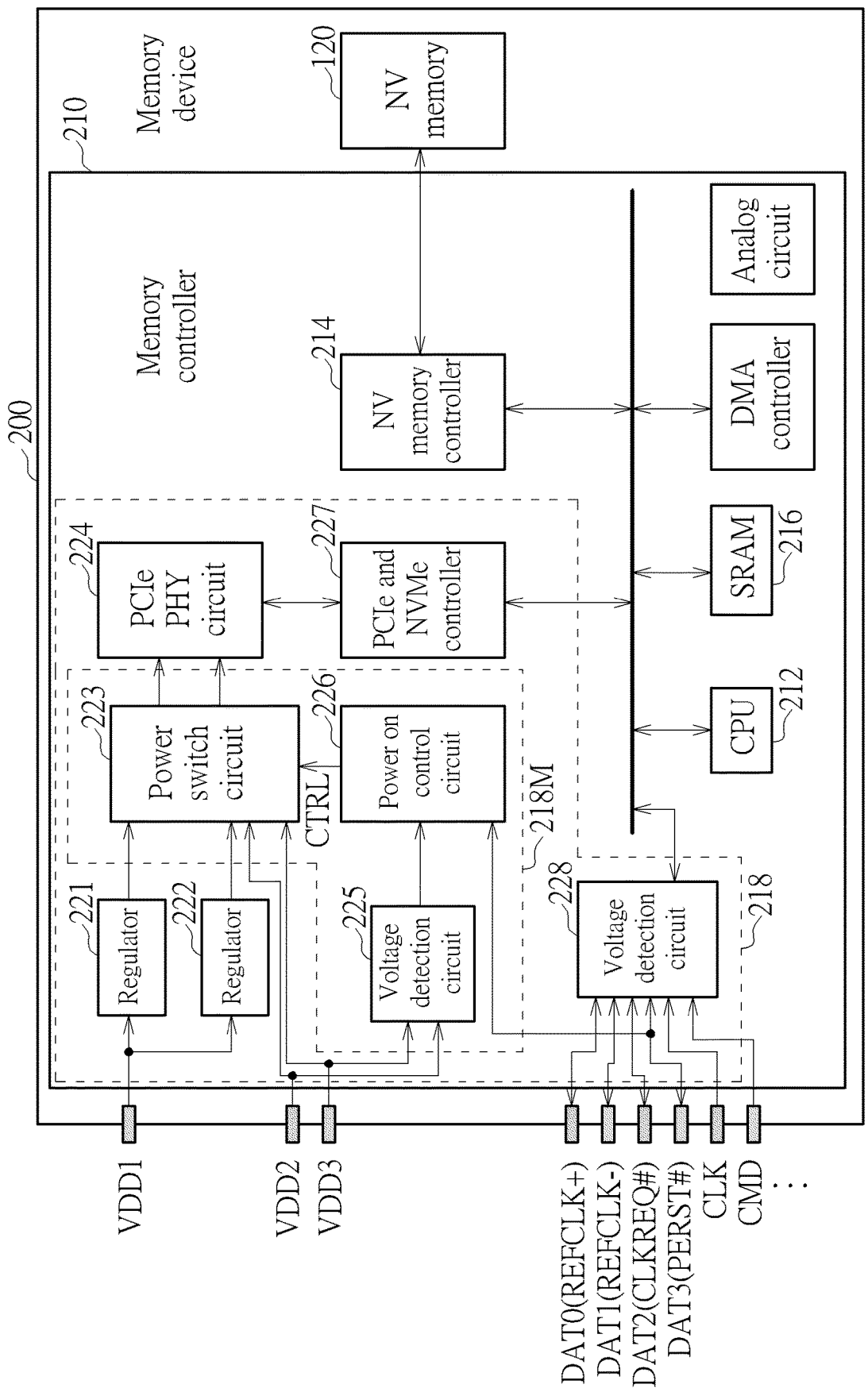
FIG. 2 is a diagram of an apparatus for performing power management in a memory device such as that shown in FIG. 1 according to an embodiment of the present invention.

FIG. 2 is a diagram of an apparatus for performing power management in a memory device such as that mentioned above according to an embodiment of the present invention. The memory device 200 (e.g. SD Express memory card), the memory controller 210 (e.g. SD Express memory card controller), the core processing unit (CPU) 212 (e.g. core processing circuit), the NV memory controller 214, the SRAM 216, the transmission interface circuit 218, and the power management circuit 218M can be taken as examples of the memory device 100, the memory controller 110, the microprocessor 112, the control logic circuit 114, the RAM 116, the transmission interface circuit 118, and the power management circuit 118M, respectively, but the present invention is not limited thereto. The memory controller 210 may comprise associated circuits such as a direct memory access (DMA) controller, an analog circuit, etc. The transmission interface circuit 218 may comprise sub-circuits such as regulators 221 and 222, a power switch circuit 223 (which may comprise the one or more power switches), a PCIe PHY circuit 224, a voltage detection circuit 225, a power on control circuit 226, a PCIe and NV Memory Express (NVMe) controller 227, and an SD interface logic circuit 228, and may interact with the host device 50 for the memory device 200 through at least one portion of terminals of the memory device 200. The transmission interface circuit 218 (e.g. the sub-circuits thereof) may be coupled to some interface terminals of the memory device 200, in which the transmission interface circuit 218 and the associated terminals may conform to multiple specifications such as that of different generations (e.g. SD 6.0 specification and SD 7.0 specification). For example, the terminals of the memory device 200 may comprise driving voltage input terminals {VDD1, VDD2, VDD3} and communications terminals {DAT0(REFCLK+), DAT1(REFCLK−), DAT2 (CLKREQ#), DAT3(PERST#), CLK, CMD, . . . } corresponding to the newer communications specification (e.g. SD 7.0 specification, etc.), and so on. For better comprehension, signals at the terminals of the memory device 200 may have the same names as these terminals, using italic type, respectively. For example, the driving voltage input terminals {VDD1, VDD2, VDD3} may be arranged to receive a set of driving voltages {VDD1, VDD2, VDD3} such as {3.3 V, 1.8 V, 1.2 V} from the host device 50, respectively. In addition, the primary names {DAT0, DAT1, DAT2, DAT3} of the first four communications terminals and the names of the driving voltage input terminals {VDD1, VDD2, VDD3} may indicate that these terminals are SD compatible, and the secondary names {REFCLK+, REFCLK−, CLKREQ#, PERST#} of the first four communications terminals may indicate the respective use of communications corresponding to the PCIe protocol (e.g. reference clock differential pair {REFCLK+, REFCLK−} for synchronization of PCIe interface timing circuit of the memory device, reference clock request CLKREQ# for requesting reference clock, and reset signal PERST# for resetting the memory device), but the present invention is not limited thereto. According to this embodiment, a set of regulators such as the regulators 221 and 222 may regulate one or more of the set of driving voltages {VDD1, VDD2, VDD3} to generate power for one or more other circuits (e.g. the PCIe PHY circuit 224), such as power for digital and analog power domains of the PCIe PHY circuit 224 (e.g. "digital power" and "analog power"), respectively. The power switch circuit 223 may control power of the PCIe PHY circuit 224 through the one or more power switches, where the PCIe PHY circuit 224 may perform physical layer operations of communications corresponding to the PCIe protocol after the power is turned on by the power switch circuit 223. With aid of voltage detection performed by the voltage detection circuit 225, the power on control circuit 226 may automatically control the power of the PCIe PHY circuit 224 through the power switch circuit 223, for example, having no need to rely on an internal clock source of the memory controller 210, where the internal clock source may be kept turned off by default, and automatically controlling the power of the PCIe PHY circuit 224 will not be hindered. The PCIe and NVMe controller 227 may perform communications corresponding to any of the PCIe protocol and the NVMe protocol when needed, and the SD interface logic circuit 228 may perform interfacing and/or communications corresponding to any of various versions of SD specification when needed. Based on the architecture shown in FIG. 2, the memory controller 210 (e.g. the transmission interface circuit 218) can perform communications according to any of the communications specifications, and more particularly, can perform communications according to SD 6.0 specification when needed and can perform communications according to SD 7.0 specification when needed.

According to some embodiments, as the power required for driving the PCIe PHY circuit 224 may vary, the associated architecture and wiring in FIG. 2 may vary. The power switch circuit 223 may be coupled to at least one portion (e.g. a portion or all) of the driving voltage input terminals {VDD1, VDD2, VDD3} directly or indirectly (e.g. through one or more regulators), and the number of regulators between the power switch circuit 223 and the aforementioned at least one portion of the driving voltage input terminals {VDD1, VDD2, VDD3} may vary. For example, the regulator 221 may regulate the driving voltage VDD1 (e.g. 3.3 V) to generate power for the digital power domain (e.g. "digital power"), and the regulator 222 may regulate the driving voltage VDD2 (e.g. 1.8 V) to generate power for the analog power domain (e.g. "analog power"). According to some embodiments, the voltage detection circuit 225 may be coupled to one or more of the driving voltage input terminals {VDD2, VDD3}. For example, the voltage detection circuit 225 may perform voltage detection on a specific driving voltage VDDx (e.g. VDD2 or VDD3) corresponding to a specific driving voltage input terminal VDDx (e.g. VDD2 or VDD3) within the driving voltage input terminals {VDD2, VDD3}, where the voltage detection circuit 225 may be coupled to the specific driving voltage input terminal VDDx (e.g. VDD2 or VDD3).

Figure 3:
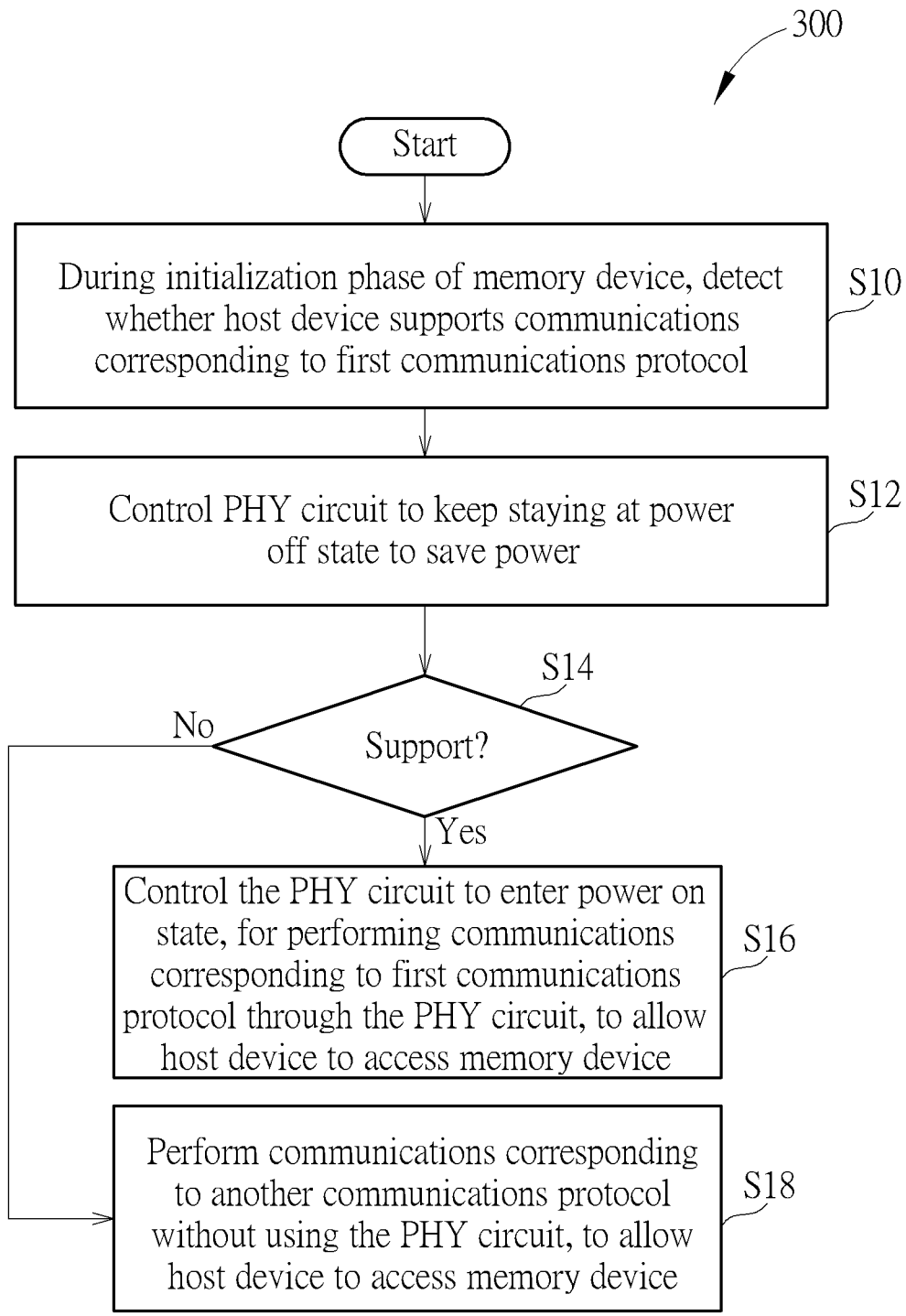
FIG. 3 is a working flow of a method for performing power management in a memory device according to an embodiment of the present invention.

FIG. 3 is a working flow 300 of a method for performing power management in a memory device according to an embodiment of the present invention, where the method can be applied to the controller (e.g. the memory controllers 110 and 210), the memory device (e.g. the memory devices 100 and 200), and an electronic device at which the memory device is installed (e.g. the electronic device 10).

In Step S10, during the initialization phase of the memory device 100 (e.g. the memory device 200), the memory controller 110 (e.g. the memory controller 210) may detect whether the host device 50 supports communications corresponding to the first communications protocol (e.g. the PCIe protocol).

In Step S12, before detecting that the host device 50 supports communications corresponding to the first communications protocol, the memory controller 110 (e.g. the memory controller 210) may control the PHY circuit 118Y (e.g. the PCIe PHY circuit 224) to keep staying at a power off state to save power, where the PHY circuit 118Y supports communications corresponding to the first communications protocol.

In Step S14, the memory controller 110 (e.g. the memory controller 210) may check whether the host device 50 supports communications corresponding to the first communications protocol. When yes, Step S16 is entered; otherwise Step S18 is entered.

In Step S16, when detecting that the host device 50 supports communications corresponding to the first communications protocol, the memory controller 110 (e.g. the memory controller 210) may control the PHY circuit 118Y (e.g. the PCIe PHY circuit 224) to enter a power on state, for performing communications corresponding to the first communications protocol through the PHY circuit 118Y, to allow the host device 50 to access the memory device 100 (e.g. the memory device 200).

In Step S18, when detecting that the host device 50 does not support communications corresponding to the first communications protocol, the memory controller 110 (e.g. the memory controller 210) may perform communications corresponding to another communications protocol without using the PHY circuit 118Y (e.g. the PCIe PHY circuit 224), to allow the host device 50 to access the memory device 100 (e.g. the memory device 200).

For better comprehension, the method may be illustrated with the working flow 300, but the present invention is not limited thereto. According to some embodiments, one or more steps may be added, deleted, or changed in the working flow 300.

According to this embodiment, the power management circuit 118M (e.g. the power management circuit 218M) may perform power management according to the method. The host device 50 may output the set of driving voltages {VDD1, VDD2, VDD3} (e.g. {3.3 V, 1.8 V, 1.2 V}) to the memory device 100 (e.g. the memory device 200). More particularly, the power switch circuit 223 may be coupled between at least one driving voltage (e.g. one or more driving voltages) of the set of driving voltages and the PHY circuit 118Y such as the PCIe PHY circuit 224, where controlling the PHY circuit 118Y to keep staying at the power off state may be performed through the power switch circuit 223. For example, the aforementioned at least one driving voltage may comprise one or more driving voltages, such as VDD1 (e.g. 3.3 V) or {VDD1, VDD2} (e.g. {3.3 V, 1.8 V}), the power switch circuit 223 may comprise multiple power switches coupled to the one or more driving voltages, and the power switches may control the digital and analog power domains of the PHY circuit 118Y such as the PCIe PHY circuit 224, respectively.

In the initialization phase, a first driving voltage of the set of driving voltages, such as the driving voltage VDD1, is typically pulled from a ground voltage level (e.g. 0 V) to a first voltage level (e.g. 3.3 V) before the specific driving voltage VDDx (e.g. VDD2 or VDD3) is pulled from the ground voltage level (e.g. 0 V) to a second voltage level (e.g. 1.8 V or 1.2 V). According to the specific driving voltage VDDx, the memory controller 110 (e.g. the memory controller 210) may detect whether the host device 50 supports communications corresponding to the first communications protocol. More particularly, the voltage detection circuit 225 may perform voltage detection on the specific driving voltage VDDx to generate a detection signal, and the power on control circuit 226 may monitor a logical state of a specific signal (e.g. DAT3(PERST#)) from the host device 50 according to the detection signal to generate a power control signal CTRL corresponding to the logical state, for controlling power of the PHY circuit 118Y such as the PCIe PHY circuit 224, where the specific signal may be received by the memory device 200 through the corresponding communications terminal DAT3(PERST#) of the memory device 200, and the power control signal CTRL may indicate whether the host device 50 supports communications corresponding to the first communications protocol. In addition, the power on control circuit 226 may comprise a one-bit storage circuit (e.g. a register or a flip-flop) which may be arranged to store one-bit information corresponding to the logical state. The power on control circuit 226 may store the one-bit information into the one-bit storage circuit according to the detection signal to generate the power control signal CTRL. For example, the detection signal may be input into a clock terminal CK of the one-bit storage circuit (e.g. the detection signal may be utilized as a clock signal of the one-bit storage circuit), and the power control signal CTRL may be an output signal of the one-bit storage circuit. Additionally, the power on control circuit 226 may invert the specific signal to generate an inverted signal of the specific signal, and monitor the logical state of the specific signal through monitoring a corresponding logical state of the inverted signal, where the corresponding logical state may be stored as the one-bit information. For example, an edge of the detection signal may indicate a transition of the specific driving voltage VDDx. In some embodiments, there may be no subsequent edge of the detection signal during a normal operation phase of the memory device 100 (e.g. the memory device 200), since there may be no further transition of the specific driving voltage VDDx in the normal operation phase.

According to some embodiments, the power to be controlled (e.g. selectively turned on or turned off) by the power switch circuit 223 may vary based on different control schemes of the method, for example, depending on the need or requirement of power to be supplied to the PCIe PHY circuit 224. Based on the architecture shown in FIG. 2, the power saving design can be applied to the SD Express memory card for the initialization phase, where the SD Express memory card may be a memory card (e.g. a tiny card) based on SD 7.0 specification. Please note that an SD card equipped with 6-bit SD interface may reach a maximum transmission rate such as 104 MB/sec. In comparison with this, the transmission interface circuit 118 (e.g. the transmission interface circuit 218) can be designed to perform communications corresponding to the PCIe protocol, to allow the memory device 100 (e.g. the memory device 200) to reach a maximum transmission rate such as 985 MB/sec while maintaining the compatibility regarding SD interface. As a result, no matter whether a host device (e.g. the host device 50) supports the newer communications specification (e.g. SD 7.0 specification) or not, the present invention method and associated apparatus (e.g. the controller such as the memory controllers 110 and 210) can guarantee that the memory device (e.g. the memory devices 100 and 200) can operate properly in various situations.

For implementing a new generation of SD card, the architecture shown in any of FIGS. 1-2 is suitable for performing power management to achieve the goal of power saving. More particularly, the PCIe PHY circuit 224 can perform PCIe communications operations according to requirements regarding the PCIe physical layer, but the PCIe PHY circuit 224 may be power consuming. The power switch circuit 223 (e.g. the power switches) can be kept turned off by default. When the memory device 200 is operating in SD interface mode, the PCIe PHY circuit 224 does not consume power. In addition, the voltage levels of the power required by the PCIe PHY circuit 224 may depend on the process for manufacturing the memory controller and/or various conditions of associated intellectual property (IP) modules. No matter which process is selected and no matter whether the conditions of the associated IP modules vary, the present invention method and associated apparatus can achieve the goal of extremely saving power.

According to some embodiments, when the SD Express memory card is erroneously inserted into a corresponding slot of a SD 4.0 (UHS2) host device, although this SD 4.0 host device may supply the driving voltage VDD2 by default, the power switch circuit 223 (e.g. the power switch coupled to the driving voltage input terminal VDD2) can prevent the PCIe PHY circuit 224 from being powered by the driving voltage VDD2 by default, since the power switch circuit 223 (e.g. the power switches) is kept turned off by default.

Figure 4:
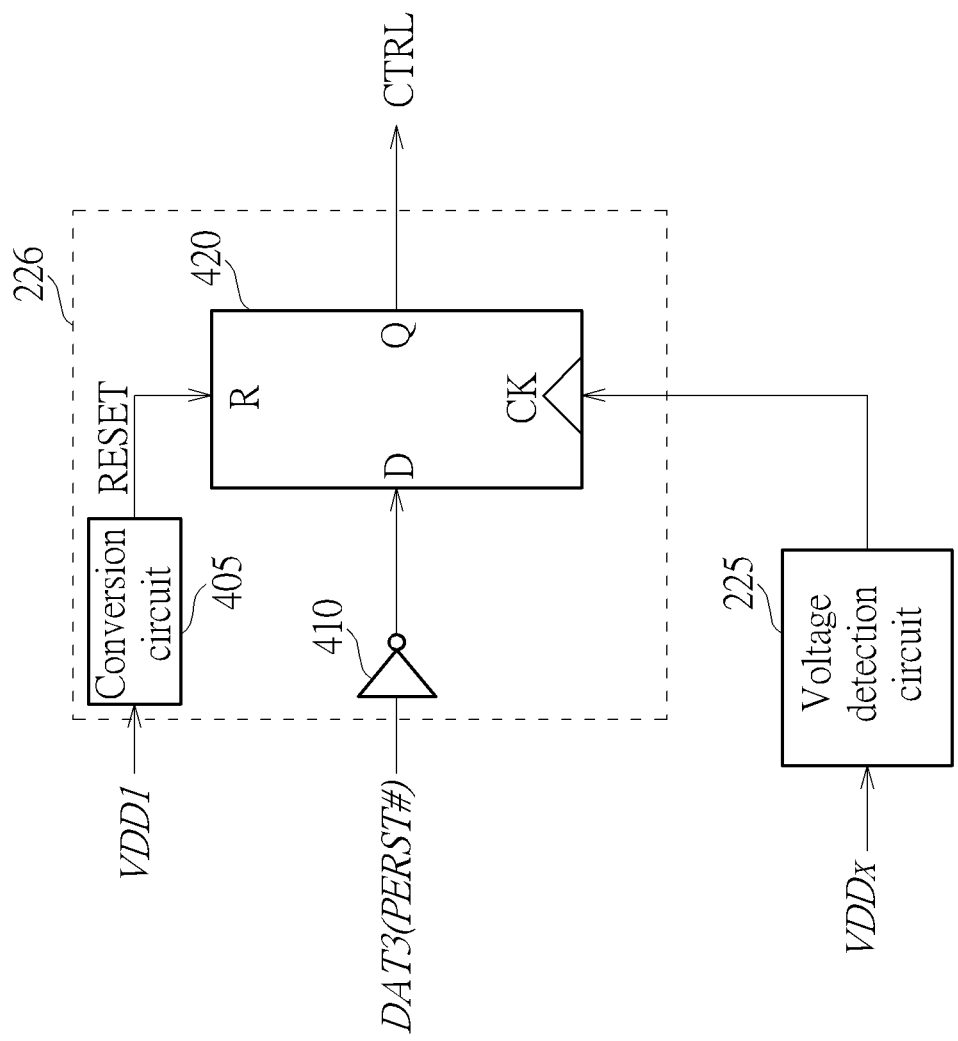
FIG. 4 illustrates some implementation details of the apparatus shown in FIG. 2 according to an embodiment of the present invention.

FIG. 4 illustrates some implementation details of the apparatus shown in FIG. 2 according to an embodiment of the present invention. For example, the power on control circuit 226 may comprise a register or a flip-flop 420, such as that having the input terminal D, the output terminal Q, the clock terminal CK, and the reset terminal R, and may comprise an inverter 410 coupled between the terminal DAT3(PERST#) and the input terminal D for inverting the signal DAT3(PERST#), and may further comprise a conversion circuit 405 (which may be referred to as the power-on-reset circuit in this embodiment), where the output terminal Q is coupled to at least one control terminal of the power switch circuit 223 (e.g. the control terminals of the power switches therein). When the memory device 200 is powered on with the driving voltage VDD1 (e.g. 3.3 V) in the beginning, the driving voltage VDD1 is arranged to reset the flip-flop 420, for example, through a reset signal RESET corresponding to the driving voltage VDD1, to ensure that there is no unknown state in the flip-flop 420. More particularly, the conversion circuit 405 may be arranged to convert the driving voltage VDD1 into the reset signal RESET, to make the reset signal RESET have a pulse corresponding to a transition (e.g. a rising edge) of the driving voltage VDD1 at the moment when the driving voltage VDD1 is pulled from the ground voltage level (e.g. 0 V) to the first voltage level (e.g. 3.3 V), and this pulse may be utilized as a reset pulse for resetting the flip-flop 420, to make the power switch circuit 223 (e.g. the power switches therein) be at the turn off state in the beginning. As a result, the power on control circuit 226 may utilize the reset signal RESET to perform the "power on reset" on the flip-flop 420. Based on the architecture shown in FIG. 4, the power switch circuit 223 (e.g. the power switches therein) can be kept turned off by default.

According to this embodiment, the voltage detect circuit 225 may comprise a voltage detector, for example, the voltage detector may be implemented with a comparator, but the present invention is not limited thereto. The comparator may receive the specific driving voltage VDDx (e.g. VDD2 or VDD3). For example, the memory device 200 may be designed to prevent using the driving voltage VDD3. When the memory device 200 does not support using the driving voltage VDD3, the specific driving voltage VDDx may represent the driving voltage VDD2 (e.g. 1.8 V). For another example, the memory device 200 may be designed to use the driving voltage VDD3. When the memory device 200 supports using the driving voltage VDD3, the specific driving voltage VDDx may represent the driving voltage VDD3 (e.g. 1.2 V). In addition, the comparator may compare the specific driving voltage VDDx (e.g. VDD2 or VDD3) with a predetermined threshold voltage to generate a comparison result signal carrying a comparison result, where the comparison result signal may be utilized as the detection signal, and may be input into the clock terminal CK. For example, a voltage level of the specific driving voltage VDDx may be pulled up (e.g. from 0 V to 1.8 V, or from 0 V to 1.2 V) at a specific time point. When the voltage level of the specific driving voltage VDDx reaches (e.g. is greater than or equal to) the predetermined threshold voltage, which may indicate that the voltage level of the specific driving voltage VDDx falls within a valid range, the comparator may change the voltage level of the comparison result signal, for example, from a low voltage level to a high voltage level; otherwise, the comparator may keep the voltage level of the comparison result signal unchanged. For better comprehension, the transition of the voltage level of the comparison result signal may be regarded as a rising edge of a "pulse" carried by the comparison result signal, such as that from the low voltage level to the high voltage level, in which the pulse width of this pulse may be quite long and may stay at the high voltage level until the specific driving voltage VDDx is pulled down (e.g. from 1.8 V to 0 V, or from 1.2 V to 0 V). This pulse may be referred to as a pseudo-pulse since the pulse width thereof is typically not as short as a normal pulse such as that of a clock signal. The power on control circuit 226 can utilize the pseudo-pulse as the clock source of the flip-flop 420. For example, the flip-flop 420 can temporarily store the data (e.g. the high/low state) of the inverted signal of the signal DAT3(PERST#) according to the clock source such as the pseudo-pulse.

As the output terminal Q is coupled to the aforementioned at least one control terminal of the power switch circuit 223 (e.g. the control terminals of the power switches therein), the power on control circuit 226 can utilize the output signal of the flip-flop at the output terminal Q as the power control signal CTRL (which may be regarded as a switching control signal of the power switches). The power control signal CTRL may carry a logical value 0 or a logical value 1, and more particularly, may be at a low level corresponding to the logical value 0 or at a high level corresponding to the logical value 1, but the present invention is not limited thereto. When the power control signal CTRL carries the logical value 1 (e.g. at the high level), the power switches are turned on to supply the power from the regulators 221 and 222 to the PCIe PHY circuit 224 as the power for the digital power domain (e.g. "digital power") and the power for the analog power domain (e.g. "analog power"), respectively; otherwise, the power switches are kept turned off. According to this embodiment, the signal DAT3(PERST#) may be low-active, and the inverted signal output from the inverter 410 toward the input terminal D may be high-active. When the signal DAT3(PERST#) is at a low level thereof (e.g. pulled down from a high level such as 3.3 V to the low level such as 0 V, and/or kept at the low level), the inverted signal is at a high level thereof (e.g. pulled up from a low level such as 0 to the high level such as 3.3 V, and/or kept at the high level). In response to the trigger of the clock source such as the pseudo-pulse, the flip-flop 420 can latch the data (e.g. the high state) of the inverted signal, and the power control signal CTRL may carry the logical value 1 (e.g. at the high level). As a result, when the voltage level of the specific driving voltage VDDx reaches (e.g. is greater than or equal to) the predetermined threshold voltage, which may indicate that the voltage level of the specific driving voltage VDDx falls within the valid range, the power on control circuit 226 turns on the power switches to supply the power from the regulators 221 and 222 to the PCIe PHY circuit 224.

According to some embodiments, as the interval between a time point of supplying the driving voltage VDD1 and a time point of supplying the driving voltage VDD3 may vary, when no SD command is detected during the initialization phase, the CPU 212 may turn off an internal clock source within the memory controller 210 to save power. In this situation, the present invention method and apparatus can utilize the voltage detector to detect the voltage level of the specific driving voltage VDDx to generate the pseudo-pulse, and can utilize the pseudo-pulse (rather than the internal clock source) as the clock source for triggering the flip-flop 420 to turn on the power switches. For better comprehension, assume that the internal clock source is a clock having the frequency of 20 megahertz (MHz) based on a certain circuitry design, in which: when the internal clock source is turned off, the memory device 200 may approximately consume a hundred microampere (mA) at the set of driving voltages; and when there is a free run clock such as the internal clock source being turned on, the memory device 200 may approximately consume five hundreds mA at the set of driving voltages; but the present invention is not limited thereto. As a result, the memory controller 210 can properly perform power management regarding the PCIe PHY circuit 224 without turning on the internal clock source. Therefore, the goal of saving power can be achieved without introducing side effects.

According to some embodiments, at the beginning of booting up the memory device 200, the host device 50 first supplies the driving voltage VDD1 (rather than any of the other driving voltages VDD2 and VDD3) to the memory device 200. Based on the architecture shown in FIG. 2 (more particularly, the architecture shown in FIG. 4), when the host device 50 enters the PCIe mode, the memory controller 210 (e.g. the power on control circuit 226) can turn on the power switches in time, to supply the power from the regulators 221 and 222 to the PCIe PHY circuit 224.

Figure 5:
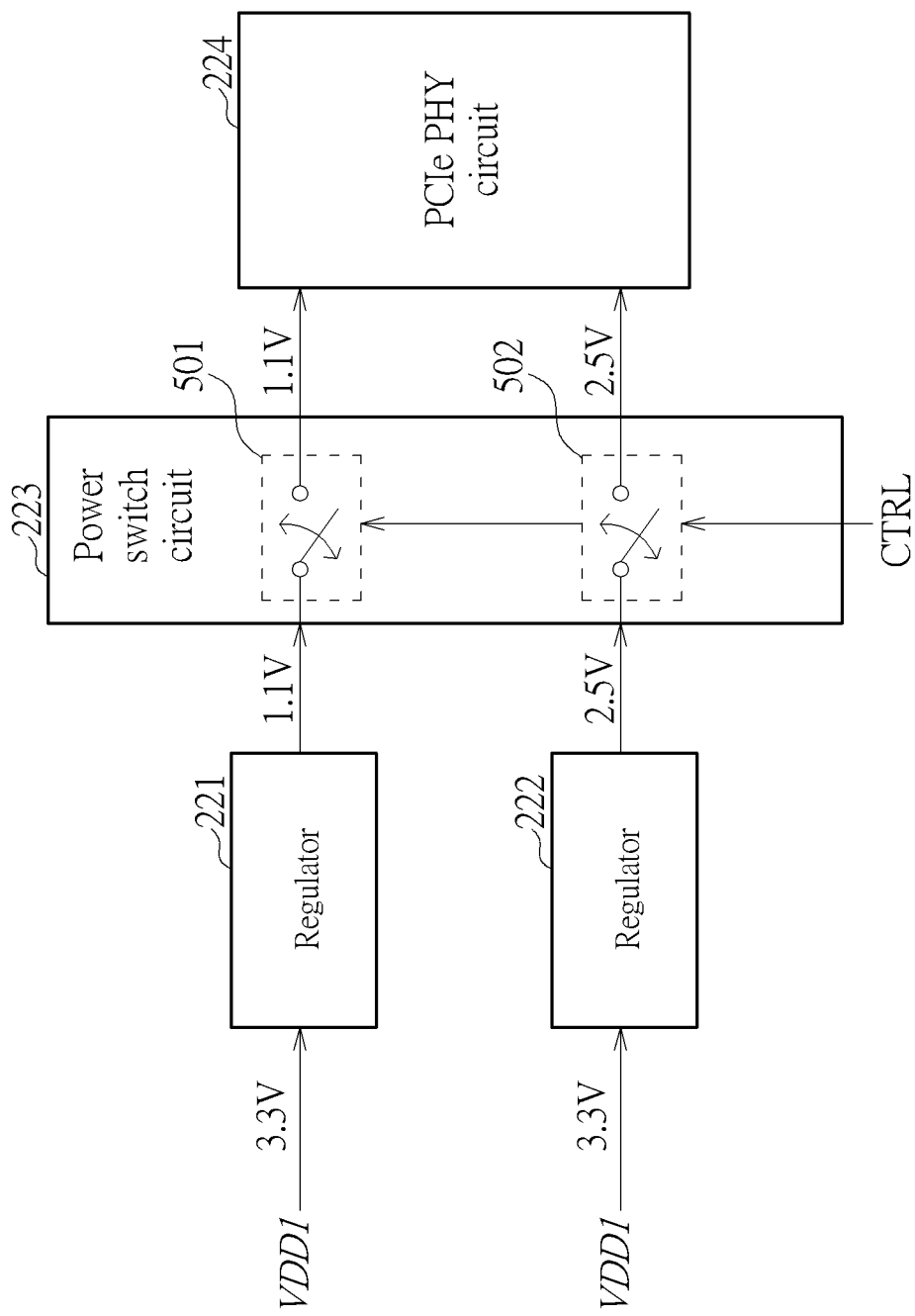
FIG. 5 illustrates a first control scheme of the method according to an embodiment of the present invention.

FIG. 5 illustrates a first control scheme of the method according to an embodiment of the present invention. When the 40 nm process is applied to implementing the PCIe PHY circuit 224, 2.5 V may be needed and may be converted from the driving voltage VDD1 (e.g. 3.3 V), and 1.1 V may be needed and may be converted from the driving voltage VDD1 (e.g. 3.3 V). The regulators 221 and 222 may perform regulation operations on the driving voltage VDD1 (e.g. 3.3 V) to convert the driving voltage VDD1 into the power for the digital power domain (e.g. "digital power" such as the regulated driving voltage 1.1 V) and the power for the analog power domain (e.g. "analog power" such as the regulated driving voltage 2.5 V), respectively. When turned on by the power on control circuit 226, the power switch circuit 223 (e.g. the power switches 501 and 502) can conduct the digital power such as the regulated driving voltage 1.1 V and the analog power such as the regulated driving voltage 2.5 V toward the PCIe PHY circuit 224, respectively; otherwise, the power switch circuit 223 (e.g. the power switches 501 and 502) can prevent conducting the digital power such as the regulated driving voltage 1.1 V and the analog power such as the regulated driving voltage 2.5 V toward the PCIe PHY circuit 224, respectively.

Figure 6:
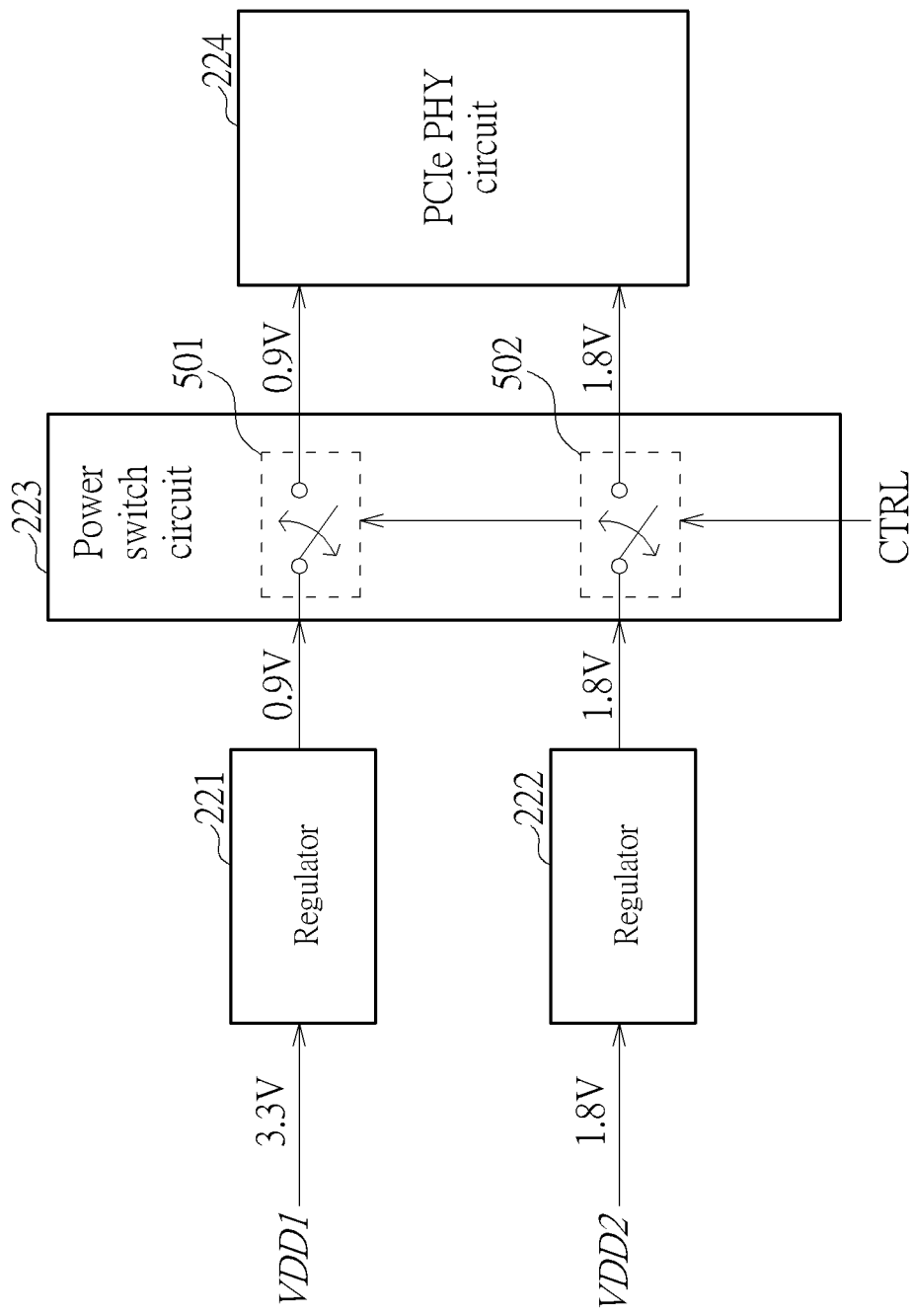
FIG. 6 illustrates a second control scheme of the method according to an embodiment of the present invention.

FIG. 6 illustrates a second control scheme of the method according to an embodiment of the present invention. When the 28 nm process is applied to implementing the PCIe PHY circuit 224, 1.8 V may be needed and may be converted from the driving voltage VDD2 (e.g. 1.8 V), and 0.9 V may be needed and may be converted from the driving voltage VDD1 (e.g. 3.3 V). The regulators 221 and 222 may perform regulation operations on the driving voltage VDD1 (e.g. 3.3 V) and the driving voltage VDD2 (e.g. 1.8 V), respectively, to convert the driving voltages VDD1 and VDD2 into the digital power such as the regulated driving voltage 0.9 V and the analog power such as the regulated driving voltage 1.8 V, respectively. When turned on by the power on control circuit 226, the power switch circuit 223 (e.g. the power switches 501 and 502) can conduct the digital power such as the regulated driving voltage 0.9 V and the analog power such as the regulated driving voltage 1.8 V toward the PCIe PHY circuit 224, respectively; otherwise, the power switch circuit 223 (e.g. the power switches 501 and 502) can prevent conducting the digital power such as the regulated driving voltage 0.9 V and the analog power such as the regulated driving voltage 1.8 V toward the PCIe PHY circuit 224, respectively.

Figure 7:
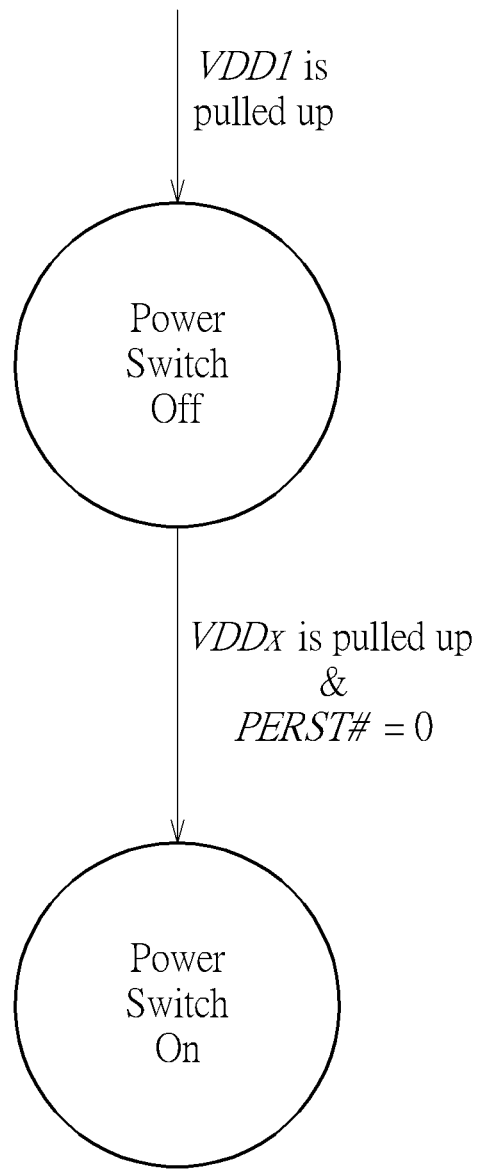
FIG. 7 illustrates an example of a state diagram.

FIG. 7 illustrates an example of a state diagram. The memory controller 110 (e.g. the memory controller 210) may properly operate in various situations during the initialization phase. For example, at the beginning of booting up the memory device 200, the host device 50 supplies the driving voltage VDD1 into the memory controller 210

(labeled "VDD1 is pulled up" in FIG. 7, for better comprehension), and the power on control circuit 226 maintains the power switch circuit 223 (e.g. the power switches 501 and 502) to keep staying at the turn off state thereof (labeled "Power Switch Off") by default. For another example, when the host device 50 supplies the specific driving voltage VDDx (e.g. VDD2 or VDD3) into the memory controller 210 in a situation where the signal DAT3(PERST#) is at the low level thereof (labeled "VDDx is pulled up & PERST#=0" in FIG. 7, for better comprehension), the power on control circuit 226 turns on the power switch circuit 223 (e.g. the power switches 501 and 502) to enter the turn on state thereof (labeled "Power Switch On"). In addition, whether to use the driving voltage VDD2 or the driving voltage VDD3 as the specific driving voltage VDDx for performing the voltage detection may depend on different designs. For example, when the memory device 200 (e.g. the memory card such as the SD Express memory card) does not support using the driving voltage VDD3, the specific driving voltage VDDx may represent the driving voltage VDD2 (e.g. 1.8 V). For another example, when the memory device 200 (e.g. the memory card) supports using the driving voltage VDD3, the specific driving voltage VDDx may represent the driving voltage VDD3 (e.g. 1.2 V).

Figure 8:
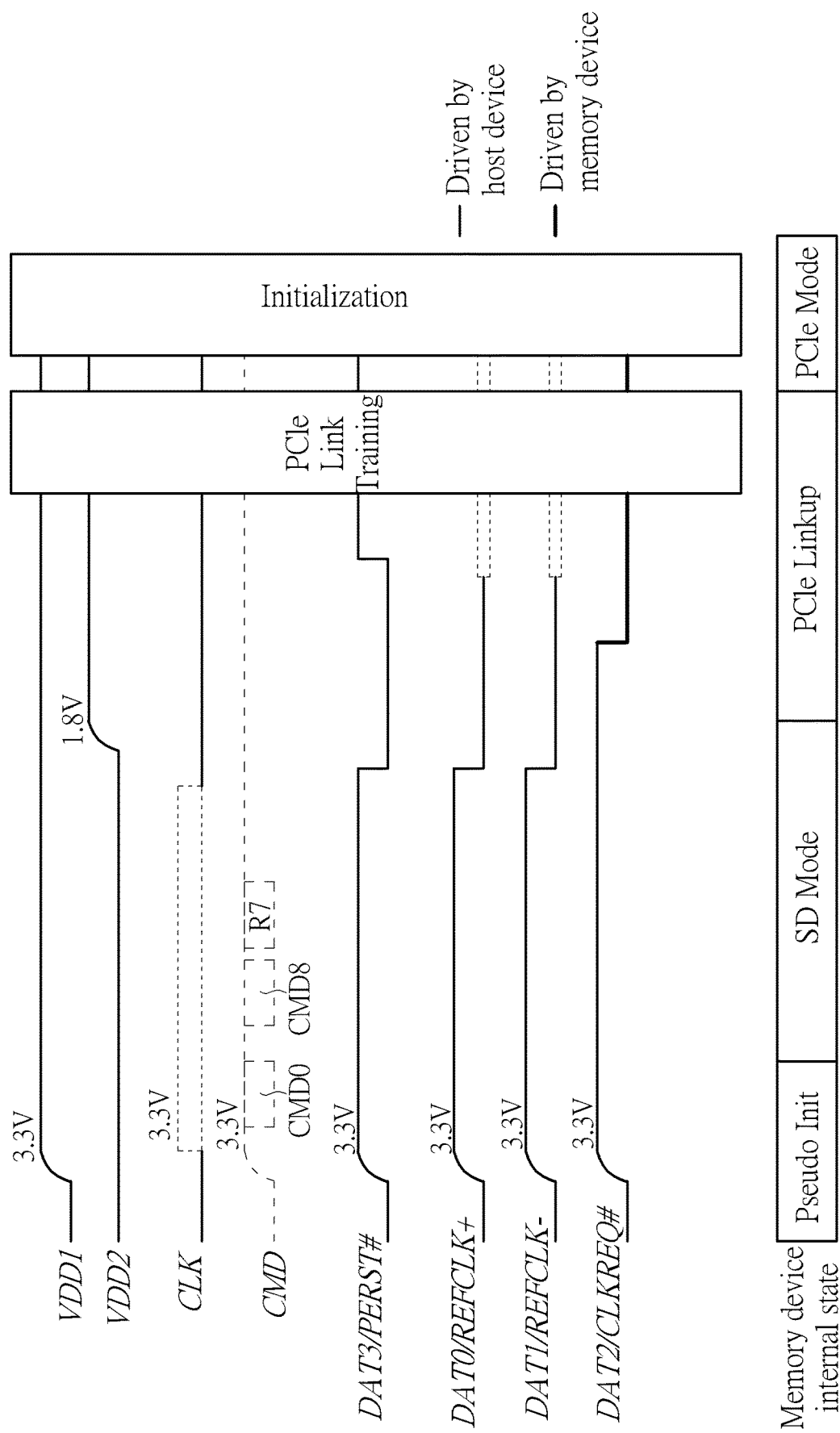
FIG. 8 illustrates an example of SD Express initialization sequence starting with issuing SD commands.
Figure 9:
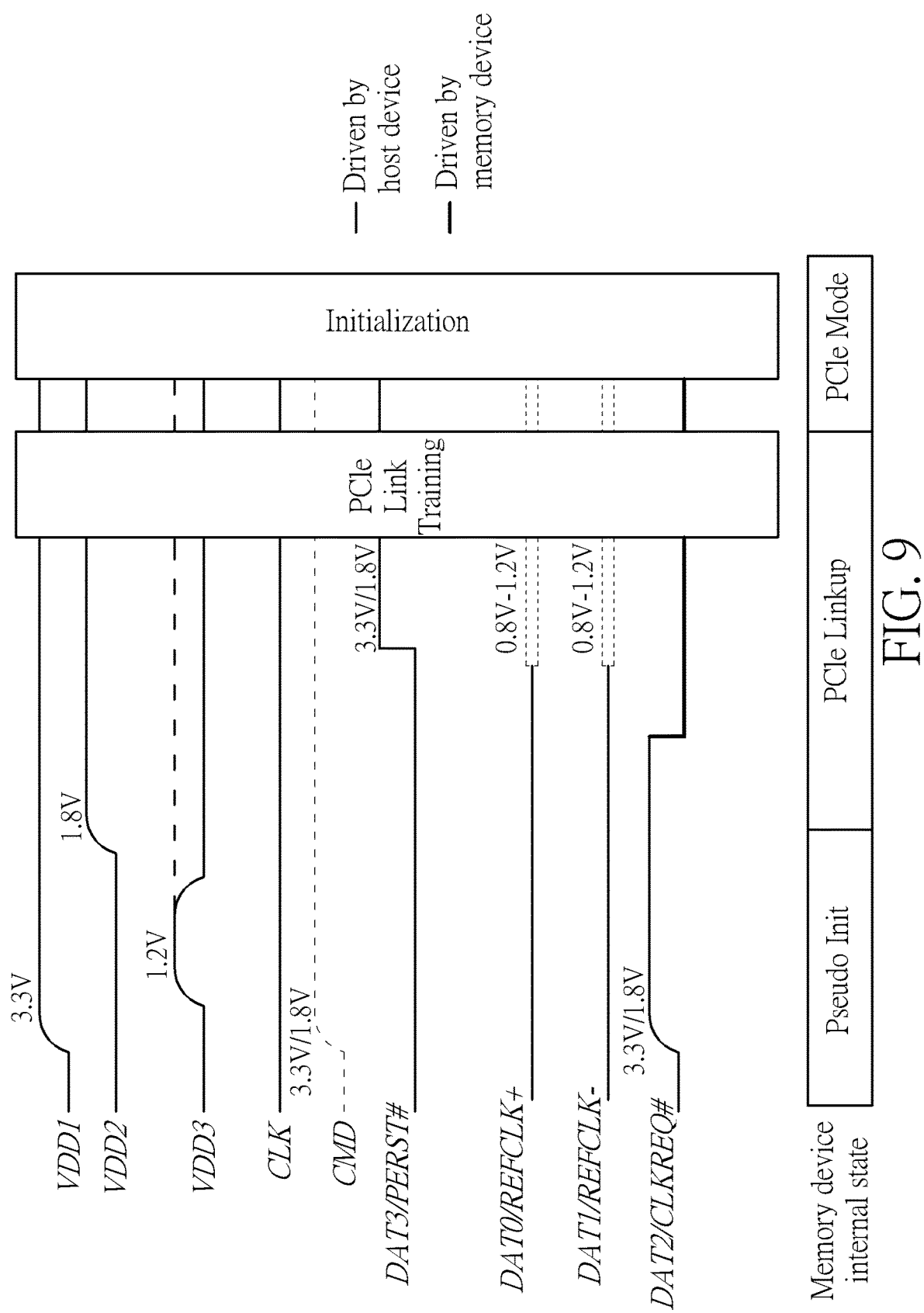
FIG. 9 illustrates an example of SD Express initialization sequence without issuing SD commands.

FIG. 8 illustrates an example of SD Express initialization sequence starting with issuing SD commands, and FIG. 9 illustrates an example of SD Express initialization sequence without issuing SD commands. The signals {CLK, CMD, DAT3(PERST#), DAT0(REFCLK+), DAT1(REFCLK−), DAT2(CLKREQ#)} may be received at the corresponding terminals {CLK, CMD, DAT3(PERST#), DAT0 (REFCLK+), DAT1(REFCLK−), DAT2(CLKREQ#)} of the memory device 200, respectively, and the memory device internal state of the memory device 200 within the initialization phase may comprise some predetermined states such as pseudo initialization (e.g. "Pseudo Init"), SD mode, PCIe linkup, and/or PCIe mode. The memory controller 210 may disable a pull-up resistor coupled to the terminal DAT3/ (PERST#) during the initialization phase, to allow the host device 50 to freely drive the signal DAT3(PERST#) when needed. More particularly, in the example shown in FIG. 8, the host device 50 may transmit the commands CMD0 and CMD8, and the memory controller 210 may reply with the response R7, where some fields of the command CMD8, such as {"PCIe Availability", "PCIe 1.2V Support"}, may carry bits {1, 1} to indicate that the host device 50 supports PCIe communications and PCIe 1.29V, and some fields of the response R7, such as {"PCIe Response", "PCIe 1.2V Support"}, may carry bits {1, 0} to indicate that the memory device 200 supports PCIe communications and does not support PCIe 1.2V, but the present invention is not limited thereto. Based on these examples, the transmission interface circuit 218 may conform to the SD 7.0 specification. In addition, the memory controller 210 is capable of controlling interactions between the memory device 200 (e.g. the memory card such as the SD Express memory card) and the host device 50 according to any of these examples during the initialization phase (e.g. at the beginning of booting up the memory device 200) to enter the PCIe interface mode, for example, in a situation where the host device 50 supports the driving voltage VDD3 but the memory card does not, but the present invention is not limited thereto. Based on the architecture shown in FIG. 2 (more particularly, the architecture shown in FIG. 4), when needed, the memory controller 210 (e.g. the power on control circuit 226) can turn on the power switches 510 and 520 in time, to supply the power from the regulators 221 and 222 to the PCIe PHY circuit 224. When there is no need to use the PCIe PHY circuit 224, the memory controller 210 (e.g. the power on control circuit 226) can maintain the power switches 510 and 520 to keep staying at the turn off state thereof by default, to save power of the memory device 200.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing power management in a memory device, the memory device comprising a non-volatile (NV) memory, the NV memory comprising at least one NV memory element, the method comprising:
during an initialization phase of the memory device, detecting whether a host device supports communications corresponding to a first communications protocol, wherein the host device outputs a set of driving voltages to the memory device, and detecting whether the host device supports communications corresponding to the first communications protocol comprises:
performing voltage detection on a specific driving voltage of the set of driving voltages to generate a detection signal; and
monitoring a logical state of a specific signal from the host device according to the detection signal to generate a power control signal corresponding to the logical state, for controlling power of a physical layer (PHY) circuit within the memory device, wherein the specific signal is received by the memory device through a corresponding communications terminal of the memory device, and wherein the power control signal indicates whether the host device supports communications corresponding to the first communications protocol, and wherein monitoring the logical state of the specific signal from the host device according to the detection signal to generate the power control signal corresponding to the logical state comprises:
storing one-bit information corresponding to the logical state into a one-bit storage circuit according to the detection signal to generate the power control signal, wherein the detection signal is input into a clock terminal of the one-bit storage circuit, and the power control signal is an output signal of the one-bit storage circuit; and
before detecting that the host device supports communications corresponding to the first communications protocol, controlling the PHY circuit a within the memory device to keep staying at a power off state to save power, wherein the PHY circuit supports communications corresponding to the first communications protocol.

2. The method of claim 1, wherein a power switch circuit within the memory device is coupled between at least one driving voltage of the set of driving voltages and the PHY circuit; and controlling the PHY circuit to keep staying at the power off state is performed through the power switch circuit.

3. The method of claim 2, wherein the at least one driving voltage of the set of driving voltages comprises one or more driving voltages; and the power switch circuit comprises multiple power switches coupled to the one or more driving voltages and arranged to control digital and analog power domains of the PHY circuit, respectively.

4. The method of claim 1, wherein in the initialization phase, a first driving voltage of the set of driving voltages is pulled from a ground voltage level to a first voltage level before the specific driving voltage of the set of driving voltages is pulled from the ground voltage level to a second voltage level.

5. The method of claim 1, wherein the one-bit storage circuit is a register or a flip-flop.

6. The method of claim 1, wherein monitoring the logical state of the specific signal from the host device according to the detection signal to generate the power control signal corresponding to the logical state further comprises:
inverting the specific signal to generate an inverted signal of the specific signal; and
monitoring the logical state of the specific signal through monitoring a corresponding logical state of the inverted signal, wherein the corresponding logical state is stored as the one-bit information.

7. The method of claim 1, wherein the detection signal is utilized as a clock signal of the one-bit storage circuit.

8. The method of claim 1, wherein an edge of the detection signal indicates a transition of the specific driving voltage.

9. The method of claim 8, wherein there is no subsequent edge of the detection signal during a normal operation phase of the memory device.

10. The method of claim 1, further comprising:
when detecting that the host device does not support communications corresponding to the first communications protocol, performing communications corresponding to another communications protocol without using the PHY circuit, to allow the host device to access the memory device.

11. The method of claim 1, further comprising:
when detecting that the host device supports communications corresponding to the first communications protocol, controlling the PHY circuit to enter a power on state, for performing communications corresponding to the first communications protocol through the PHY circuit, to allow the host device to access the memory device.

12. A memory device, comprising:
a non-volatile (NV) memory, arranged to store information, wherein the NV memory comprises at least one NV memory element; and
a controller, coupled to the NV memory, arranged to control operations of the memory device, wherein the controller comprises:
a processing circuit, arranged to control the controller according to a plurality of host commands from a host device, to allow the host device to access the NV memory through the controller; and
a transmission interface circuit, coupled to the processing circuit, arranged to perform communications with the host device for the memory device, wherein the transmission interface circuit comprises:
a voltage detection circuit and
a power on control circuit, coupled to the voltage detection circuit, wherein the power on control circuit comprises:
a one-bit storage circuit;
wherein:
during an initialization phase of the memory device, the controller detects whether the host device supports communications corresponding to a first communications protocol, wherein the host device outputs a set of driving voltages to the memory device, wherein:
the voltage detection circuit is arranged to perform voltage detection on a specific driving voltage of the set of driving voltages to generate a detection signal; and
the power on control circuit is arranged to monitor a logical state of a specific signal from the host device according to the detection signal to generate a power control signal corresponding to the logical state, for controlling power of a physical layer (PHY) circuit within the transmission interface circuit, wherein the specific signal is received by the memory device through a corresponding communications terminal of the memory device, and wherein the power control signal indicates whether the host device supports communications corresponding to the first communications protocol, wherein:
the one-bit storage circuit is arranged to store one-bit information corresponding to the logical state, wherein the power on control circuit stores the one-bit information corresponding to the logical state into the one-bit storage circuit according to the detection signal to generate the power control signal, the detection signal is input into a clock terminal of the one-bit storage circuit, and the power control signal is an output signal of the one-bit storage circuit; and
before detecting that the host device supports communications corresponding to the first communications protocol, the controller controls the PHY circuit within the transmission interface circuit to keep staying at a power off state to save power, wherein the PHY circuit supports communications corresponding to the first communications protocol.

13. The memory device of claim 12, wherein the transmission interface further comprises:
a power switch circuit, coupled between at least one driving voltage of the set of driving voltages and the PHY circuit, wherein through the power switch circuit, the controller controls the PHY circuit to keep staying at the power off state.

14. The memory device of claim 12, wherein in the initialization phase, a first driving voltage of the set of driving voltages is pulled from a ground voltage level to a first voltage level before the specific driving voltage of the set of driving voltages is pulled from the ground voltage level to a second voltage level.

15. An electronic device comprising the memory device of claim 12, and further comprising:
the host device, coupled to the memory device, wherein the host device comprises:
at least one processor, arranged for controlling operations of the host device; and
a power supply circuit, coupled to the at least one processor, arranged for providing power to the at least one processor and the memory device;
wherein the memory device provides the host device with storage space.

16. A controller of a memory device, the memory device comprising the controller and a non-volatile (NV) memory, the NV memory comprising at least one NV memory element, the controller comprising:
a processing circuit, arranged to control the controller according to a plurality of host commands from a host device, to allow the host device to access the NV memory through the controller; and a transmission interface circuit, coupled to the processing circuit, arranged to perform communications with the host device for the memory device, wherein the transmission interface circuit comprises:
a voltage detection circuit and
a power on control circuit, coupled to the voltage detection circuit, wherein the power on control circuit comprises:
a one-bit storage circuit wherein:
during an initialization phase of the memory device, the controller detects whether the host device supports communications corresponding to a first communications protocol, wherein the host device outputs a set of driving voltages to the memory device, wherein:
the voltage detection circuit is arranged to perform voltage detection on a specific driving voltage of the set of driving voltages to generate a detection signal; and
the power on control circuit is arranged to monitor a logical state of a specific signal from the host device according to the detection signal to generate a power control signal corresponding to the logical state, for controlling power of a physical layer (PHY) circuit within the transmission interface circuit, wherein the specific signal is received by the memory device through a corresponding communications terminal of the memory device, and wherein the power control signal indicates whether the host device supports communications corresponding to the first communications protocol, wherein:
the one-bit storage circuit is arranged to store one-bit information corresponding to the logical state, wherein the power on control circuit stores the one-bit information corresponding to the logical state into the one-bit storage circuit according to the detection signal to generate the power control signal, the detection signal is input into a clock terminal of the one-bit storage circuit, and the power control signal is an output signal of the one-bit storage circuit; and
before detecting that the host device supports communications corresponding to the first communications protocol, the controller controls the PHY circuit within the transmission interface circuit to keep staying at a power off state to save power, wherein the PHY circuit supports communications corresponding to the first communications protocol.

* * * * *